United States Patent

Wendell

[11] Patent Number: 5,983,346
[45] Date of Patent: Nov. 9, 1999

[54] POWER-UP INITIALIZATION CIRCUIT THAT OPERATES ROBUSTLY OVER A WIDE RANGE OF POWER-UP RATES

[75] Inventor: Dennis Lee Wendell, Pleasanton, Calif.

[73] Assignee: Advanced Micro Devices, Inc., Sunnyvale, Calif.

[21] Appl. No.: 08/938,781

[22] Filed: Sep. 26, 1997

[51] Int. Cl.$^6$ .................................................. G06F 9/445
[52] U.S. Cl. ............................................ 713/1; 713/100
[58] Field of Search .................................. 713/1, 2, 100; 712/225, 229; 341/144; 307/272; 371/66; 365/189.05; 327/141, 115

[56] References Cited

U.S. PATENT DOCUMENTS

| | | | |
|---|---|---|---|
| 4,484,087 | 11/1984 | Mazin et al. | 307/272 |
| 5,111,067 | 5/1992 | Wong et al. | 307/272.3 |
| 5,283,792 | 2/1994 | Davies, Jr. et al. | 371/66 |
| 5,767,709 | 1/1996 | McClure | 327/141 |
| 5,812,463 | 8/1997 | Park | 365/189.05 |
| 5,828,249 | 10/1998 | Sessions | 327/115 |
| 5,844,515 | 1/1997 | Park | 341/144 |

Primary Examiner—Joseph E. Palys
Assistant Examiner—Rijue Mai
Attorney, Agent, or Firm—Skjerven, Morrill, MacPherson, Franklin & Friel LLP; Ken J. Koestner

[57] ABSTRACT

A power-up initialization circuit includes a transistor that generates a positive leakage current at the onset of a power-up ramp voltage. The positive leakage current drives a first node connected to a latch to a first defined state. The latch drives a complementary second node to a second defined state, complementary to the state of the first node. The latch acts as a keeper that is switchable and allows current flow during power-up but prevents leakage current when the power-up is complete and nodes are set to selected states. A keeper is a circuit element that holds a dynamic circuit to a static behavior. One type of keeper is a latch. Another type of keeper is a MOSFET transistor having a thin channel width and a gate terminal connected to a reference such as a ground or VSS reference. A power-up initialization circuit includes a capacitive switch connected to a power source and connected to a power-up control node, and a current source connected to the power source and connected to an internal node. The current source has a control terminal connected to the power-up control node. The current source sets a state at the internal node according to a signal on the power-up control node. The power-up initialization circuit furthers includes a latch connected to the internal node and connected to a controlled node. The latch sets a state of the controlled node opposite the state of the internal node.

16 Claims, 6 Drawing Sheets

POWER-UP INITIALIZATION CIRCUIT THAT OPERATES ROBUSTLY OVER A WIDE RANGE OF POWER-UP RATES

BACKGROUND OF THE INVENTION

1. Field of the Invention

The present invention relates to power-up initialization circuits. More specifically, the present invention relates to power-up initialization circuits that robustly initialize digital circuits to a known state over a wide range of power-up rates.

2. Description of the Related Art

Digital circuits such as microprocessors typically include system logic that responds to the application of operating power by resetting the microprocessor to a known state and asserting a RESET signal. The microprocessor samples the asserted RESET signal and immediately flushes and initializes all internal resources and the microprocessor internal state including the state of pipelines and caches, the floating-point state, the state of special purpose processors such as a Multi-Media extension (MMX) processor, and all registers. The microprocessor typically jumps to a preset program address to begin instruction execution.

The system power-up logic includes power-up initialization circuits that first place the digital circuits into a known state. Some digital circuits include self-resetting type logic for holding a circuit element to a known state without the usage of a dedicated reset signal. Unfortunately, the element must be held to a specified state. If the element powers up in the wrong state, the microprocessor is typically unable to initialize or initialization is extended to a long duration that consumes power.

Power-up initialization circuits are generally divided into two classes. A first class of power-up initialization circuits ensures that a node is placed in a predetermined state, generally either a digital high (VDD) state or a digital low (VSS) state, upon application of power to a circuit. A second class of power-on initialization circuits emits a momentary pulse of a selected time duration during power-up, then returns to a steady quiescent state.

For the first class of power-up initialization circuits, a node is placed in the predetermined state upon power-up usually by applying an increasing voltage to a gate of a transistor as the power supply voltage gradually increases in a linear ramp fashion. The power supply may ramp up at a wide range of rates. One of the problems addressed by the first class of power-up initialization circuit is the difficulty of achieving a consistent, robust response over a wide range of power-on ramping rates of the power supply.

The difficulty of attaining a suitable power-up initialization response is compounded for large and complex integrated circuits such as microprocessors. Microprocessors include many complex and highly diverse circuit portions that generate competing electrical effects, mainly capacitive coupling at various nodes in the integrated circuit, while devices are operating in the subthreshold voltage region. These competing electrical effects are sometimes critical to circuit performance.

What is needed is a power-up initialization circuit that ensures designated internal circuit nodes are set in selected states within a suitable time duration. What is needed is a circuit and operating method for initializing nodes of a circuit to a known state during a power-up transient. What is further needed is a power-up initialization circuit and technique that performs initialization without activation of special reset signals. What is additionally needed is a power-up initialization circuit and operating method that guarantees the setting and maintaining of nodes to the known state.

SUMMARY

A power-up initialization circuit includes a transistor that generates a positive leakage current at the onset of a power-up ramp voltage. The positive leakage current drives a first node connected to a latch to a first defined state. The latch drives a complementary second node to a second defined state, complementary to the state of the first node. The latch acts as a keeper that is switchable and allows current flow during power-up but prevents static current when the power-up is complete and nodes are set to selected states. A keeper is a circuit element that holds a dynamic circuit to a static behavior. One type of keeper is a latch. Another type of keeper is a MOSFET transistor having a drain connected to the node to be held and a gate terminal and source terminal connected to a reference such as a ground or VSS reference.

In accordance with an embodiment of the present invention, a power-up initialization circuit includes a capacitor connected to a power source and connected to a power-up control node, and a current source connected to the power source and connected to an internal node. The current source has a control terminal connected to the power-up control node. The current source sets a state at the internal node according to a signal on the power-up control node. The power-up initialization circuit further includes a latch connected to the internal node and connected to a controlled node. The latch sets a state of the controlled node opposite the state of the internal node.

Many advantages are achieved by the described power-up initialization circuit and operating technique. It is advantageous that selected nodes are guaranteed to be placed in a selected state upon power-up. It is further advantageous that nodes initialize to a known state without usage of a reset signal and that floating nodes are permanently held to a known state. The transient response of the power-up initialization circuit and operating method is fast. It is highly advantageous that the power-up initialization circuit operates robustly over a wide range of power-up ramp rates.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
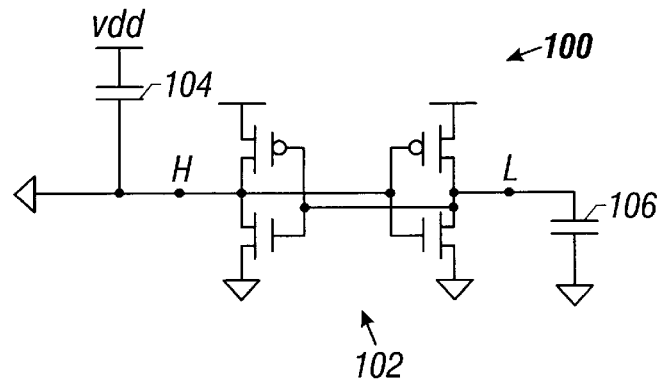
FIG. 1 is a schematic block diagram illustrating a circuit implementing a technique for performing power-up initialization.

FIG. 1 is a schematic block diagram illustrating a circuit 100 implementing one technique for performing power-up initialization. The circuit 100 includes a flip-flop 102 connected to a first capacitor 104 at a first node H and connected to a second capacitor 106 at a second node L. The capacitor 104 is referenced to power source VDD and the capacitors 106 is referenced to ground. Transistors in the flip-flop 102 are biased so that the first node H tends settle at a high state and the second node L tends to settle to a low state. The capacitors 104 and 106 generally are large. The usage of large capacitors is suitable for static circuits with no timing requirements. However, for dynamic circuits the response time of the power-up initialization circuit 100 tends to be unsuitably lengthy. Furthermore, the power-up initialization circuit 100 does not operate reliably to consistently drive the nodes H and L to the proper voltage levels in response to variable power-up ramp rates.

Figure 2:
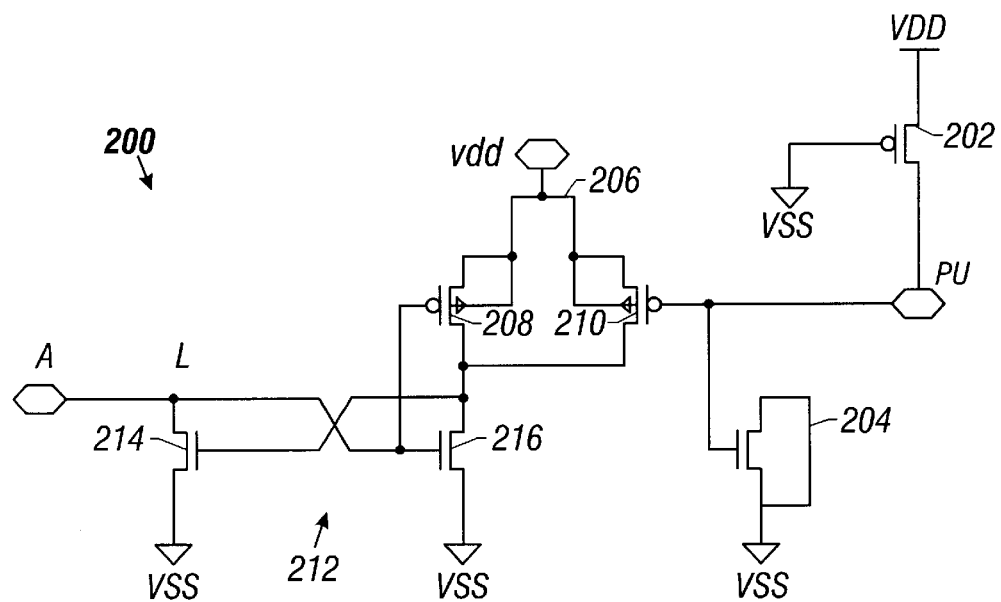
FIG. 2 is a schematic circuit diagram which illustrates an embodiment of a power-up initialization circuit according to an embodiment of the present invention.

Referring to FIG. 2, a schematic circuit diagram illustrates an embodiment of a power-up initialization circuit 200 that controls the state of a controlled node A on system power-up. The power-up initialization circuit 200 includes a PMOS power-up transistor 202 with a source-drain pathway between a digital high power source VDD and an power-up node PU and with a gate terminal connected to a digital low power source VSS. The PMOS power-up transistor 202 serves as a keeper for holding the powerup node PU static. Powerup node PU initially is charged to VSS and PMOS power-up transistor 202 gradually pulls powerup node PU high, deactivating current source PMOS transistor 210 to eliminate static current. A capacitor 204 is connected between the power-up node PU and digital low power source VSS. In the illustrative embodiment, the capacitor 204 is connected to the power-up node PU, a common node among a plurality of redundant circuits so that the capacitor 204 is relatively large in comparison to coupling on the word line connected to node A.

The power-up initialization circuit 200 includes a PMOS transistor 208 that allows the regenerative latch 212 to change state when the controlled node A is switched to a low state with the NMOS transistor 214 acting as a keeper which holds the other end of the word line. The output signal sets the state of internal node H and is applied to a regenerative latch 212 to drive an internal node L, which is connected to controlled node A, to a state opposite to the state of internal node H. The PMOS transistor 208 has a source-drain pathway connected between the digital high power source VDD and an internal node H, and has a gate terminal connected to a controlled node A. The backgate of PMOS transistor 208 is connected to VDD. The PMOS transistor 210 has a source-drain pathway connected between the digital high power source VDD and an internal node H, and has a gate terminal connected to the power-up node PU. The backgate of PMOS transistor 210 is connected to VDD. The PMOS transistor 210 is a current source that, during an initial part of a power-up ramp, operates in subthreshold conduction but subsequently operates in a normal, linear conduction region of saturation, depending on terminal characteristics. In the region of subthreshold conduction, the PMOS transistor 210 has a subthreshold leakage.

The power-up initialization circuit 200 also includes the regenerative latch 212 with paired active devices, NMOS transistor 214 and NMOS transistor 216, that are generally asymmetric. NMOS transistor 214 has a source-drain pathway connected between an internal node L and digital low power source VSS, and has a gate terminal connected to the internal node H. The internal node L is connected to the node A. NMOS transistor 216 has a source-drain pathway connected between the internal node H and VSS, and a gate terminal connected to the node A. In the illustrative embodiment, the NMOS transistor 214 has twice the width of NMOS transistor 216. The power-up initialization circuit 200 drives the NMOS transistor 214 to power-up in the "ON" state.

Figure 3:
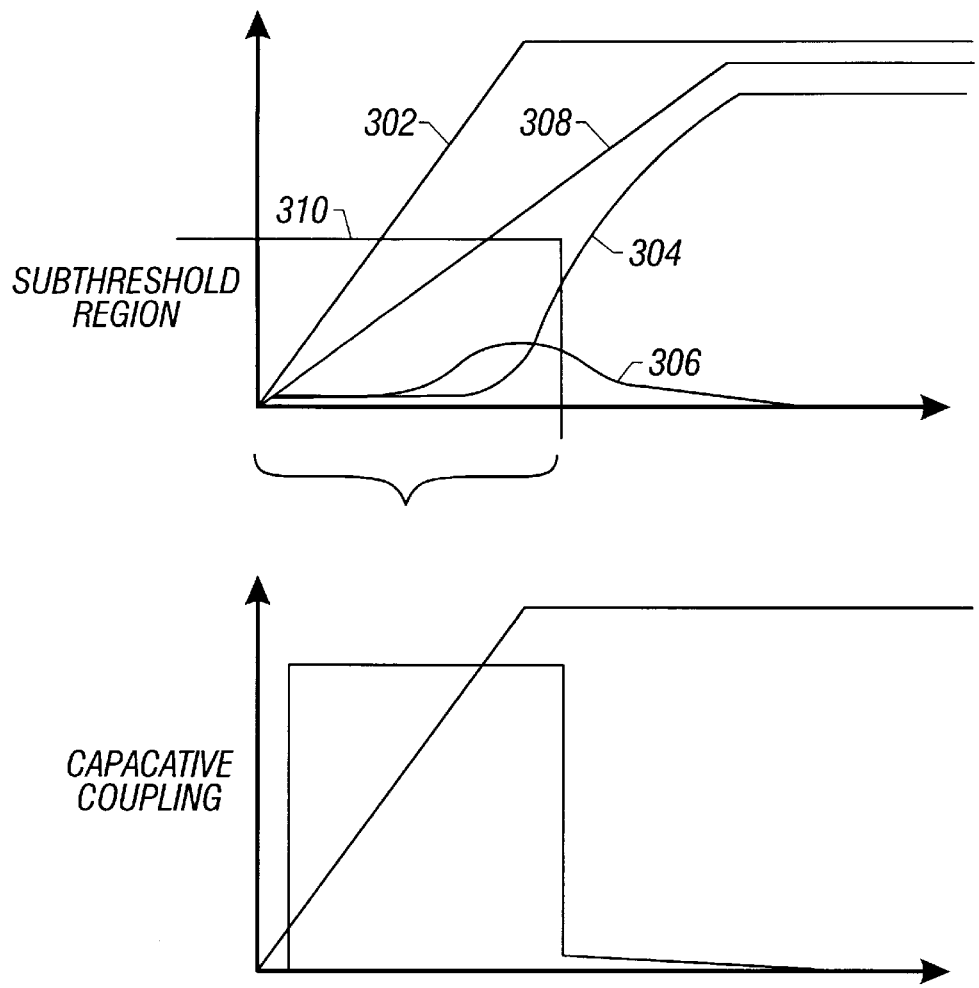
FIG. 3 is a graph showing a time history of voltage waveforms including an increasing ramp of the digital high power source VDD during power-up, the voltage at internal node H, and the voltage at internal node L.

Referring to FIG. 3 in combination with FIG. 2, a graph illustrates a time history of voltage waveforms showing an increasing ramp 302 of the digital high power source VDD during power-up, the voltage 304 at internal node H, and the voltage 306 at internal node L. A purpose of the power-up initialization circuit 200 is to influence the regenerative latch 212 to power-up into a known state in which the internal node H is set to the digital high power source VDD and the internal node L has the digital low power source VSS. The NMOS transistors 214 and 216 are unbalanced in size to assist in directing the internal node H and the internal node L to attain the desired state.

The capacitor 204 is near ground (VSS) potential having virtually no charge when power-up begins. The initial charge on the capacitor 204 is assumed to be 0V, which is usually a valid assumption when the power supply is disconnected for a short time. The PMOS power-up transistor 202 and capacitor 204 are connected at the power-up node PU, at the gate of PMOS transistor 210. The PMOS power-up transistor 202 and capacitor 204 control the gate of PMOS transistor 210 so that PMOS transistor 210 is initially activated and sourcing current $i_{initial}$ to pull the internal node H to the level of the digital high power source VDD.

At early levels of application of the ramp 302, the transistors in the power-up initialization circuit 200 are operating in subthreshold conduction 310. In the subthreshold region 310, the transistors initially have an exponential response and the internal nodes H and L are well-behaved, although some oscillation or crossing occurs. Essentially no devices are fully "ON" in the subthreshold region.

The power-up initialization circuit 200 responds to a ramp power supply voltage 302 applied to the digital high power source VDD by driving the internal node L, which is connected to the node A, to a low state (VSS) and driving the internal node H to a high state (VDD). The PMOS power-up transistor 202 and capacitor 204 operate in combination as a switch to gradually apply power 308 to active device, PMOS transistor 210, in the power-up initialization circuit 200. As the ramp voltage is applied to the power-up initialization circuit 200, the PMOS transistors 208 and 210 generate an initial current to the internal node H to drive the internal node H to a high state (VDD), fully powering VDD at the pull-up node PU and deactivating the PMOS transistor 210. The PMOS transistor 210 is advantageously deactivated when VDD is fully powered to prevent PMOS transistor 210 from conducting current with activation of NMOS transistor 216 when a high (VDD) signal is applied to the node A, thereby preventing a static (DC) current in the circuit.

The PMOS transistors 208 and 210 generate a sufficient current to drive the internal node H to the high stage (VDD) despite capacitive coupling effects from circuit elements that are external to the power-up initialization circuit 200 and connected to controlled node A. The PMOS power-up transistor 202 and the capacitor 204 function to deactivate the power-up initialization circuit 200 following a suitable time delay. The internal node L and the internal node H are well-behaved, having voltage levels that reach a defined state of high (VDD) or low (VSS) in a suitable interval, but may oscillate a small amount or have relative signal levels of the internal node L and internal node H that cross.

In summary, at the first application of power to a completely deactivated circuit, the power-up initialization circuit 200 advantageously activates the PMOS transistor 210. The PMOS transistor 210, upon activation, generates a bias current to control the regenerative latch 212. However once the power-up operation is complete and the bias current is to be eliminated, the PMOS transistor 210 is deactivated to eliminate static or DC current. The gate terminal of PMOS transistor 210 is controlled by the power-up node PU to prevent static current on the node A. The power-up initialization circuit 200 advantageously operates over a wide range of power-up ramp rates, typically a range from approximately 100 $\mu$s to about 300 ms.

Figure 4:
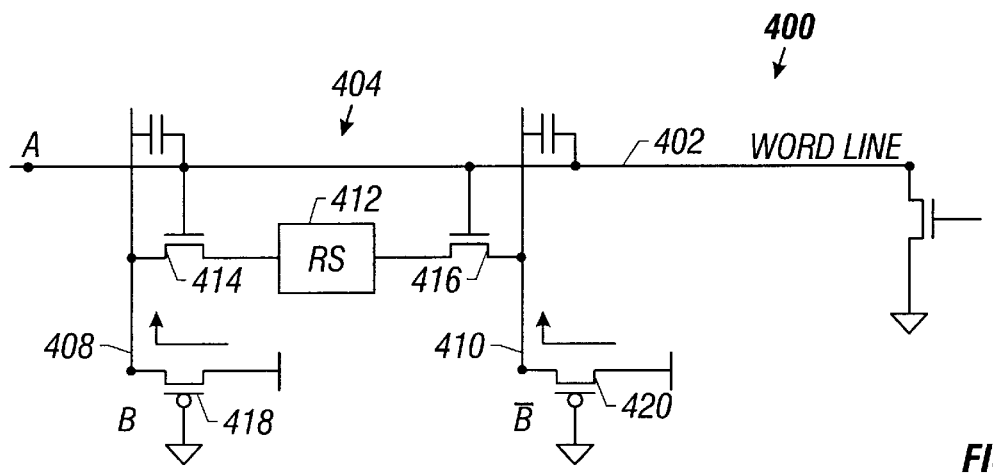
FIG. 4 is a schematic circuit diagram depicting an embodiment of a memory circuit that utilizes the power-up initialization circuit to attain a predefined state upon power-up.

One purpose of the power-up initialization circuit 200 is to supply sufficient charge to counteract a charge arising from capacitive coupling of energy from competing devices in a circuit. Referring to FIG. 4, a schematic circuit diagram depicts an embodiment of a memory circuit 400 that utilizes the power-up initialization circuit 200 to attain a predefined state upon power-up. The memory circuit 400 includes a word line 402 that is connected to the common node A of the power-up initialization circuit 200. The common node A is common to a plurality of bit lines in the memory circuit 400. A power-up initialization circuit 200 is connected to each word line 402. In the illustrated section of the memory circuit 400, a memory cell 404 is connected between a bit_line 408, a bit_bar_line 410, and the word line 402. The memory cell 404 is typically a transfer gate and includes a bistable circuit such as an R/S latch 412 connected between two access transistors 414 and 416. Access transistor 414 is connected to the bit_line 408, the word line 402, and the R/S latch 412. Access transistor 416 is connected to the bit_bar_line 410, the word line 402, and the R/S latch 412. Typically the bit_line 408 and bit_bar_line 410 are loaded with PMOS devices. The bit_line 408 is loaded with a PMOS device 418 and the bit_bar_line 410 is loaded with a PMOS device 420. During power-up, the PMOS devices 418 and 420 rapidly, for example with a time constant $\tau_{RC}$ of 1pF*1k$\Omega$, drive bit lines such as bit_line 408 and bit_bar_line 410, further tending to drive the word line 402 and generating an energy transfer among the memory cells throughout the crossing members of the memory circuit 400. This energy transfer is a capacitive coupling effect that interferes with circuit operation during system power-up. For example, if many word lines are allowed to activate the transfer gates of many memory cells, the static current could prevent power-up of the entire microprocessor.

The power-up initialization circuit 200 connected to the word line 402 operates to supply a sufficient charge at the node A to counteract the capacitive coupling effect of the bit lines. For example, one embodiment of a memory circuit 400 includes 256*256 memory cells to generate a substantial capacitive coupling effect that draws current from the power supply via the bit lines. Simultaneous powering of all 256*256 memory cells would hinder powering of other circuit blocks on the integrated circuit. Powering of the memory cells does not ultimately prevent powering of other circuits since the bit lines, such as bit_line 408 and bit_bar_line 410, clamp at the drain-source current ($i_{DS}$) of the PMOS devices (e.g. 418 and 420) and drift to VSS. However, if an equilibration network is included, the bit-lines draw substantial current. By counteracting the capacitive coupling effect of a circuit, the power-up initialization circuit 200 advantageously improves the behavior of various nodes within the circuit, driving desired internal nodes to a known state in a suitable time interval. Many diverse circuits are powered when a power source ramp is first applied to a processor. For many of the diverse circuits, no control is possible during power-up. In the circuits where control during power-up is possible, such control is advantageously exercised to reduce power-up duration and conserve power.

Figure 5:
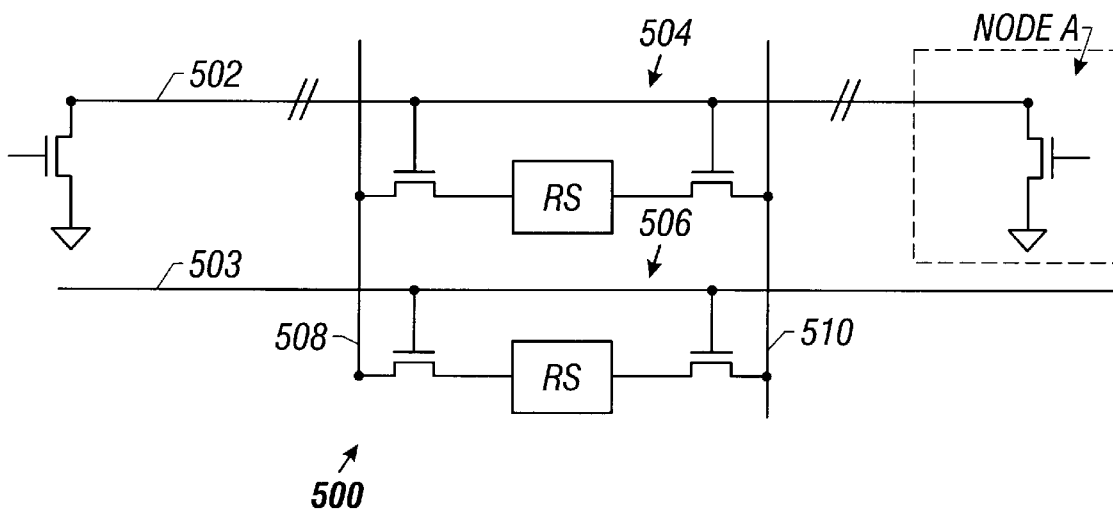
FIG. 5 is a schematic circuit diagram depicting a memory circuit that utilizes the power-up initialization circuit to improve system reliability under conditions of a broken memory cell word line.

The power-up initialization circuit 200 is useful not only for improving integrated circuit behavior during power-up, but also for improving system reliability. Referring to FIG. 5, a schematic circuit diagram depicts a memory circuit 500 that utilizes the power-up initialization circuit 200 to improve system reliability under conditions of a broken memory line. The illustrative section of memory circuit 500 includes a first word line 502 and a second word line 503, a bit_line 508 and a bit_bar_line 510. The first word line 502 and second word line 503 are redundant to allow correct operation when a word line is broken. Two memory cells 504 and 506. The first memory cell 504 is connected to the first word line 502 and the second memory cell 506, a redundant memory cell, is connected to the second, redundant word line 503. The power-up initialization circuit 200 is shown connected to the first word line 502 at a node A. FIG. 5 is useful for illustrating the operation of the power-up initialization circuit 200 in improving system reliability and detecting defects such as a broken word line. The first word line 502 has a break in the example. The memory circuit 500 typically includes a keeper circuit (not shown) on the left side of the word lines 502 and 503. The keeper circuit holds the word lines to a low (VSS) state.

In a memory circuit that does not include the power-up initialization circuit 200, a break in the word line 502 would cause a floating section of the word line 502. In the present example, the floating section of the word line 502 causes the redundant memory cells 504 and 506 to potentially assume mutually opposite states in which a node at the connection between the memory cell 504 and the bit_line 508 is in a low (VSS) state and a node at the connection between the memory cell 506 and the bit_line 508 is in a high (VDD) state. The mutually opposite states of the memory cells 504 and 506 causes a pull-up current arising from the memory cell 504 to compete with a pull-up current arising from the memory cell 506. In a memory circuit that does not include the power-up initialization circuit 200, a memory test might or might not detect the defect. However, a break 510 in the segment of the word line 402 could cause a coupling current to arise through the operation of the memory cell 504 that allows the memory circuit to operate correctly during testing but to operate randomly during actual operations, leading to reliability problems.

To assure reliable operation, the memory circuit 500 includes the power-up initialization circuit 200 that serves as a keeper at the word line.

The power-up initialization circuit 200 is useful in other circuits in addition to memory circuits and redundancy circuits. Referring to FIG. 6, a schematic circuit diagram illustrates a handshake circuit 602 in the L1 instruction cache 702. In a previous embodiment of a handshake circuit, a large loop was formed causing extraneous signals to arise that degraded circuit operation. The power-up initialization circuit 200 is employed to intersect the loop and place nodes at the intersection points A and B in a known state to allow the handshake circuit 602 to power-up properly. The power-up initialization circuit 200 allows a DC current to flow to ground (VSS) but if a signal is present to activate the node A, the signal feeds back to deactivate the PMOS power-up transistor 202 so that no static power dissipates for a lengthy time period.

Figure 7:
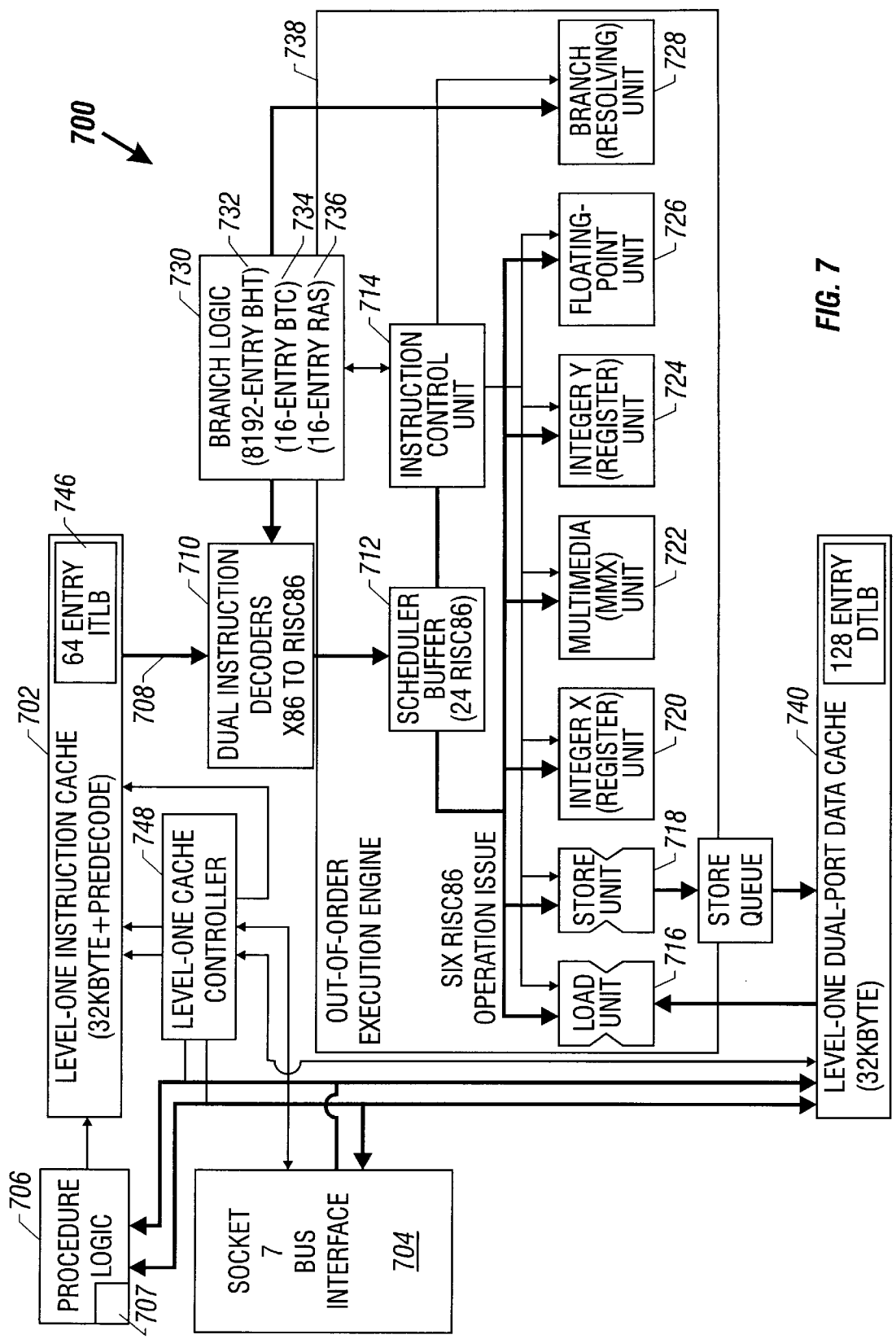
FIG. 7 is an architectural block diagram which illustrates an embodiment of a microprocessor in accordance with an embodiment of the present invention.

Referring to FIG. 7, a schematic block diagram illustrates an embodiment of an AMD-K6 microprocessor 700 within which the power-up initialization circuit 200 is implemented. The microprocessor 700 is an X86 instruction set-compatible microprocessor implementing a set of Multi-Media eXtenstions (MMX). A level-one (L1) instruction cache 702 begins predecoding instructions obtained from a processor system bus interface 704 during filling of the 32KB two-way associative L1instruction cache 702. The L1 instruction cache 702 includes a 64-entry instruction translational lookahead buffer (ITLB) 746. Bypass (not shown) and storage buffers (not shown) for instructions (4×16) and predecode (4×20) to the L1 instruction cache 702 are supplied to allow data-in and data flow-back to cache output terminals.

A level-one cache controller 748 controls caching in the L1 instruction cache 702. The L1 instruction cache 702 uses a Most Recently Used (MRU) prediction technique to predict the way selection on cache accesses. A misprediction in the way selection results in a penalty of one cycle. The L1 instruction cache 702 line replacement algorithm is Least Recently Used (LRU) although an alternative random replacement algorithm is supported using an SR5.ICERLR configuration bit. The L1 instruction cache 702 also supports a direct-mapped replacement algorithm, reducing the cache size from 32KB to 16KB, using an SR5.ICDM configuration bit. The L1 instruction cache 702 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 700 includes predecode logic 706 and a predecode cache 707 to identify instruction boundaries and fill the L1 instruction cache 702. Once the L1 instruction cache 702 is filled, predecode bits are stored in the 20kB predecode cache 707. Predecode bits resolved during the predecoding operation are stored in a 20KB predecode cache 707. Predecode logic 706 includes a first stage of instruction decode logic. Data from the L1 instruction cache 702 are fetched by fetch logic 708 and transferred to dual instruction decoders 710. The dual instruction decoders 710 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 710 are transferred to a RISC86 Op Scheduler and buffer 712. The RISC86 Op Scheduler 712 holds up to 24 RISC Ops and stores a total of 48 registers using register renaming. The Scheduler 712 contains logic to track instructions from decode to retirement, determining dependencies, scheduling execution, and committing architectural state. The Scheduler 712 is structured as a FIFO queue with instructions entering the queue four at one time to match the macroinstruction decoder bandwidth and up to four instructions retiring at one time at the end of the queue. Instructions enter the Scheduler 712 after decoding or fetching and remain in the scheduler queue until retirement. The Scheduler 712 queue is a general structure for usage for all categories of instructions and thus serves to hold instructions directed to different execution units. The Scheduler 712 utilizes implicit register renaming, which is based on position within the queue rather than explicit tag assignments, so that the Scheduler 712 avoids usage of full renaming hardware.

The Scheduler 712 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 712. The eight group terms are combined in a three-level tree to create a group carry in terms Cgrp[7:0]. The group carry terms Cgrp[7:0] are used within each group to select the operand source Op.

The RISC86 Op Scheduler 712, under control of an instruction control unit 714, issues up to six RISC86 Operations using out-of-order issuing to seven parallel execution units. The execution units speculatively execute the RISC86 Ops to generate results. The RISC86 Op Scheduler 712 retires the results in-order. The execution units include a load unit 716, a store unit 718, an integer X register unit 720, a Multi-Media eXtension (MMX) unit 722, an integer Y register unit 724, a floating-point unit (FPU) 726, and a branch resolving unit 728. A branch logic unit 730 implements a branch prediction operation that uses two-level branch prediction based on an 8192-entry Branch History Table (BHT) 732, a 16-entry Branch Target Cache (BTC) 734, and a 16-entry Return Address Stack (RAS) 736.

The dual instruction decoders 710 translate X86 instructions on-the-fly into corresponding RISC86 Ops. The RISC86 Ops are executed by an instruction core 738 that is essentially a RISC superscalar processing engine. The fetch logic 708 fetches up to sixteen instruction bytes each cycle from the L1 instruction cache 702 and transfers the instruction bytes into an instruction buffer (not shown) preceding the dual instruction decoders 710 so that the instruction buffer is maintained at capacity. The dual instruction decoders 710 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 712. The RISC86 Op Scheduler 712 controls and tracks multiple aspects of RISC86 Op issue and execution.

The microprocessor 700 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 712, functioning as a reorder buffer, commits the RISC86 Ops in-order to ensure precise exception handling and full operational comparability with X86 architecture standards. The RISC86 Op Scheduler 712 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 712 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 716 loads data via a level-one (L1) dual-port data cache 740 which receives data from an external memory (not shown) via the processor system bus interface 704. Bypass (not shown) and storage buffers (not shown) for data (4×16) to the data cache 740 are supplied to allow data-in and data flow-back to cache output terminals.

The data cache 740 includes a 128-entry data translational lookahead buffer (DTLB) 744. The data cache 740 is a 2-way set-associative, 32KB size cache with a 64 byte line-size and 32-byte sub-blocking. The data cache 740 fills on the basis of the 32-byte sub-block units. In contrast to the L1 instruction cache 702, the data cache 740 uses a Least Recently Missed (LRM) selection technique which is generally a more accurate way selection scheme than the LRU technique of the L1 instruction cache 702. In the LRM scheme, the line that first enters the cache is replaced. An alternative random replacement algorithm is supported and activated through usage of a SR5.DCERLR configuration bit. The data cache 740 also supports a direct-mapped replacement algorithm, reducing the cache size from 32KB to 16KB, using an SR5.DCDM configuration bit.

The data cache 740 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 740 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 718 transfers data to the data cache 740 through a store queue 742.

The MMX unit 722 is implemented to incorporate an X86 instruction subset called the Multi-Media eXtensions (M thereby supporting a growing number of applications in the areas of communications and multimedia. The MMX unit 722 supports the new instructions and the new data types that are defined by the MMX standard to increase processor performance in the targeted applications. The MMX unit 722 executes a Single Instruction, Multiple Data (SAD) technique to process multiple operands of 8, 16, or 32 bits in a 64-bit data path to perform highly parallel and computationally intensive algorithms that are typical for multimedia applications. The MMX unit 722 supports 57 new instructions that execute additions, subtractions, multiplies, multiply-accumulates, logical shifts, arithmetic shifts, and several other operations. Most operations are executed on operands of any data type.

Figure 8:
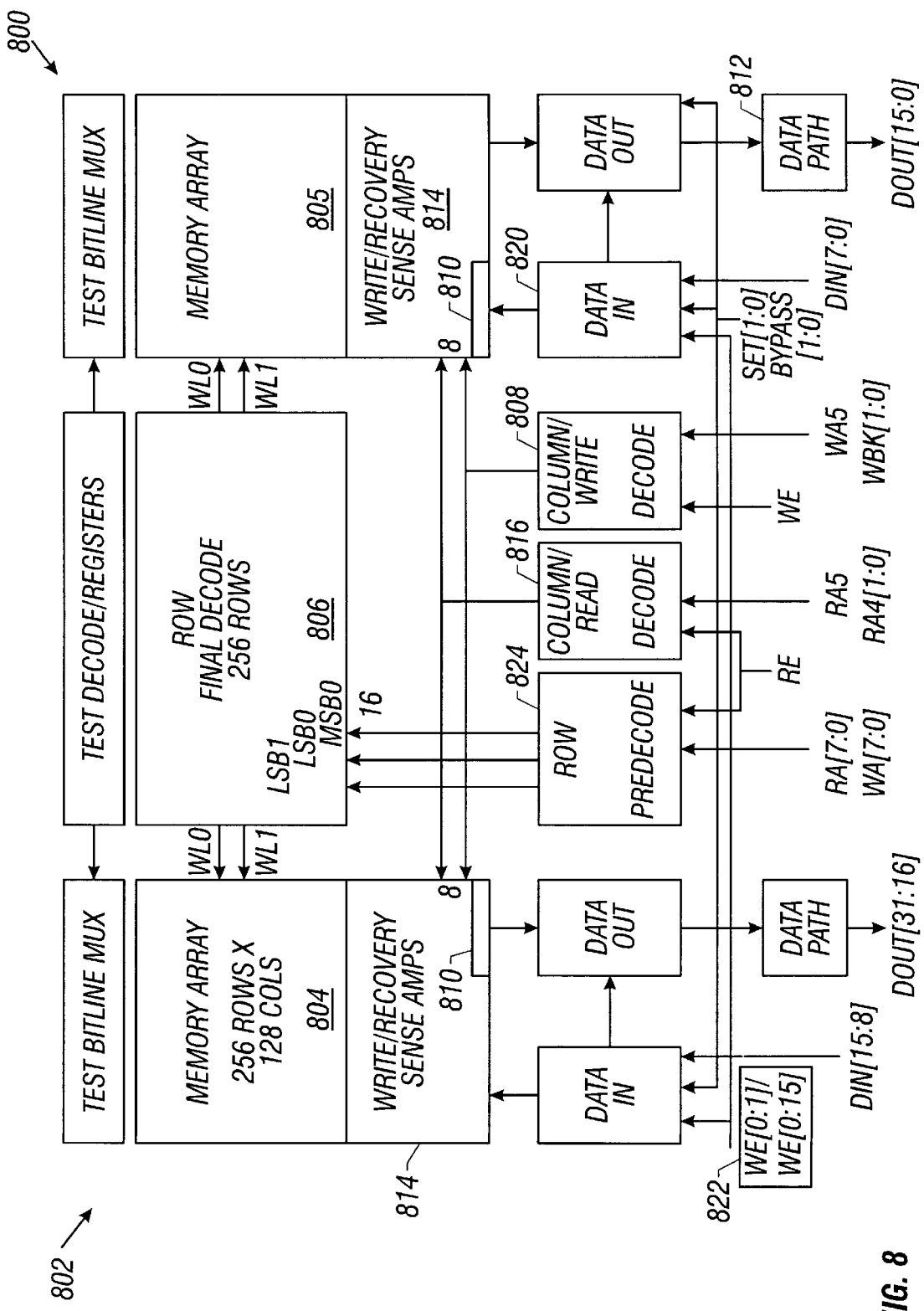
FIG. 8 is a schematic block diagram illustrating an embodiment of a cache which is suitable for usage as the data cache or the instruction cache shown in FIG. 7.

Referring to FIG. 8, a schematic block diagram shows an embodiment of a cache 800 which is suitable for usage as the L1 instruction cache 702 or the data cache 740 shown in FIG. 7, or the predecode cache (not shown). The cache 800 includes a plurality of word lines. The power-up initialization circuit 200 is connected to the word lines for improving system reliability. The microprocessor 700 has several level-one (L1) caches including the 32kB L1 instruction cache 702, the 32kB data cache 740, and the 20kB predecode cache 706. The L1 instruction cache 702 and the data cache 740 are 32kB, two-way set-associative caches with a 64 byte line size, 32 byte sub-blocking, and constructed in 8kB blocks. The predecode cache is constructed in 10kB blocks. The L1 instruction cache 702 and data cache 740 are filled on a sub-block basis, physically-tagged, and virtually-indexed with bits 13:6, where bits 13:12 are translated address bits. Synonyms and aliasing are handled in hardware. The L1 instruction cache 702 and data cache 740 maintain mutual exclusion to simplify handling of self-modifying code. A hit-under-miss capability is supported. Each of the L1 instruction cache 702 and the data cache 740 include 256 sets. Each set contains two ways (or lines) and each line contains two sub-blocks so supply a total storage of 256—2—64B=32kB.

FIG. 8 depicts a cache block 802 having a size of 8kB. The illustrative cache block 802 includes two cache arrays 804 and 805, each having 256 rows and 128 columns. The cache block 802 supports a byte write function. Row decode 806, column write decode 808, sense amplifier decode 810, and datapath 812 circuits utilize dynamic logic with keepers for delay improvement. The dynamic circuits are held static by weak keepers. While the decode 806, 808, and 810 and datapath 812 circuits are dynamic logic, data input circuits 820, bypass circuits (not shown), and storage buffers (not shown) are circuits constructed using conventional-type CMOS logic.

A write eviction buffer 822 has conventional-type memory cells to efficiently implement 4×256 storage locations using CMOS logic. Asynchronous input control signals are connected to the write eviction buffer 822 to access the four storage levels. Predecode expansion logic 824 is implemented in dual-rail, dynamic, non-clocked logic.

The cache block 802 uses time multiplexing to perform one read operation and one write operation per clock cycle using a read column select and column read decode 816 that are separate from a write column select and column write decode 818.

Predecode expansion logic (not shown) is implemented in dual-rail dynamic non-clocked logic. A scan functionality is implemented in sense amplifiers 814 to supply array bit-mapping and datapath logic testability. Testability is further enhanced by usage of separate array and wordline power supplies (not shown) so that that retention is tested at the time of wafer sort in a manufacturing process to determine functionality of p-channel pull-up transistors (not shown) in the memory cells. Dual word-lines (not shown) are used in each row in combination with a one-of-two block select to reduce power consumption.

The row decode 806 drives word lines wl to the two cache arrays 804 and 805 for both read and write operations. The row decode 806 includes flip-flops (not shown) and multi-plexing (not shown) for write addresses and read addresses that is located after the flip-flops. The row decode 806 includes pairs of wordline drivers per memory cell pitch and decoded by the least significant column decode bit so that either or both word lines are selectively activated dependent on wrap-around between upper or lower cache line words. The paired wordline structure advantageously reduces power consumption.

The L1 instruction cache 702 and the data cache 740 have physical tags, handle synonyms and aliasing in hardware, support hit under miss, and maintain mutual exclusion to assist the handling of self-modifying code.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A power-up initialization circuit comprising:
    a capacitive switch coupled to a power source and coupled to a power-up control node;
    a current source coupled to the power source and coupled to an internal node, the current source having a control terminal coupled to the power-up control node, the current source setting a state at the internal node according to a signal on the power-up control node;
    a latch coupled to the internal node and coupled to a controlled node, the latch setting a state of the controlled node opposite the state of the internal node.

2. A power-up initialization circuit according to claim 1 wherein:
    the capacitive switch includes:
        a power-up PMOS transistor having a source-drain pathway coupled between the power source and the power-up control node and having a gate terminal coupled to a reference; and
        a capacitor coupled between the power-up PMOS transistor at the power-up control node and the reference.

3. A power-up initialization circuit according to claim 1 wherein:
    the current source includes a PMOS transistor having a source-drain pathway coupled between the power source and the internal node and having a gate terminal coupled to the power-up control node.

4. A power-up initialization circuit according to claim 3 wherein:
    the current source begins sourcing current to the internal node at an application of power by the power source and terminates sourcing current when the internal node is charged to a predetermined state.

5. A power-up initialization circuit according to claim 1 wherein:
    the current source includes a pair of source and drain-coupled PMOS transistors each having a source-drain pathway coupled between the power source and the internal node, a first of the PMOS transistors having a gate terminal coupled to the power-up control node and a second of the PMOS transistors having a gate terminal coupled to the controlled node.

6. A power-up initialization circuit according to claim 5 wherein:
    the current source begins sourcing current to the internal node at an application of power by the power source and terminates sourcing current when the internal node is charged to a predetermined state.

7. A power-up initialization circuit according to claim 5 wherein:
    the pair of source and drain-coupled PMOS transistors are symmetric transistors.

8. A power-up initialization circuit according to claim 1 wherein:
    the current source is a differential amplifier having differential inputs from the power-up control node and the controlled node.

9. A power-up initialization circuit according to claim 1 wherein:
    the latch operates as a switchable keeper.

10. A power-up initialization circuit according to claim 1 wherein:
    the latch includes:
        a first NMOS transistor having a source-drain pathway coupled between the internal node and the reference and having a gate terminal coupled to the controlled node; and
        a second NMOS transistor having a source-drain pathway coupled between the controlled node and the reference and having a gate terminal coupled to the internal node.

11. A power-up initialization circuit according to claim 10 wherein:
    the first and second NMOS transistors are asymmetric.

12. A storage comprising:
    a plurality of storage cells arranged in an array of rows and columns;
    a plurality of bit lines coupling the array of storage cells into columns;
    a plurality of word lines coupling the array of storage cells into rows, the plurality of word lines including a redundant word line for a row;
    a power-up initialization circuit coupled to a word line, the power-up initialization circuit including:

a capacitive switch coupled to a power source and coupled to a powerup control node;

a current source coupled to the power source and coupled to an internal node, the current source having a control terminal coupled to the power-up control node, the current source setting a state at the internal node according to a signal on the power-up control node;

a latch coupled to the internal node and coupled to a controlled node, the latch setting a state of the controlled node opposite the state of the internal node.

13. A processor comprising:

an execution engine;

an instruction decoder coupled to the execution engine, the instruction decoder decoding instructions and supplying operations to the execution engine for execution;

a storage coupled to the instruction decoder, the storage supplying instructions to the instruction decoder for decoding into operations, the storage including:

a plurality of storage cells arranged in an array of rows and columns;

a plurality of bit lines coupling the array of storage cells into columns;

a plurality of word lines coupling the array of storage cells into rows, the plurality of word lines including a redundant word line for a row;

a power-up initialization circuit coupled to a word line, the power-up initialization circuit including:

a capacitive switch coupled to a power source and coupled to a power-up control node;

a current source coupled to the power source and coupled to an internal node, the current source having a control terminal coupled to the power-up control node, the current source setting a state at the internal node according to a signal on the power-up control node;

a latch coupled to the internal node and coupled to a controlled node, the latch setting a state of the controlled node opposite the state of the internal node.

14. A processor comprising:

an execution engine;

a storage coupled to the execution engine; and a power-up initialization circuit coupled to a word line, the power-up initialization circuit including:

a capacitive switch coupled to a power source and coupled to a powerup control node;

a current source coupled to the power source and coupled to an internal node, the current source having a control terminal coupled to the power-up control node, the current source setting a state at the internal node according to a signal on the power-up control node;

a latch coupled to the internal node and coupled to a controlled node, the latch setting a state of the controlled node opposite the state of the internal node.

15. A method of initializing a circuit comprising:

generating a positive leakage current at the onset of a power-up ramp voltage;

driven by the positive leakage current, driving a first node connected to a latch to a first defined state;

responsive to the latch, driving a complementary second node to a second defined state complementary to the first defined state.

16. A method of initializing a circuit according to claim 15 further comprising:

operating the latch as a keeper that is switchable including:

allowing current flow during power-up; and preventing leakage current when power-up is complete and nodes are set to selected states.

* * * * *

UNITED STATES PATENT AND TRADEMARK OFFICE
CERTIFICATE OF CORRECTION

PATENT NO. : 5,983,346

DATED : November 9, 1999

INVENTOR(S) : Dennis Lee Wendell

Figure 6A:
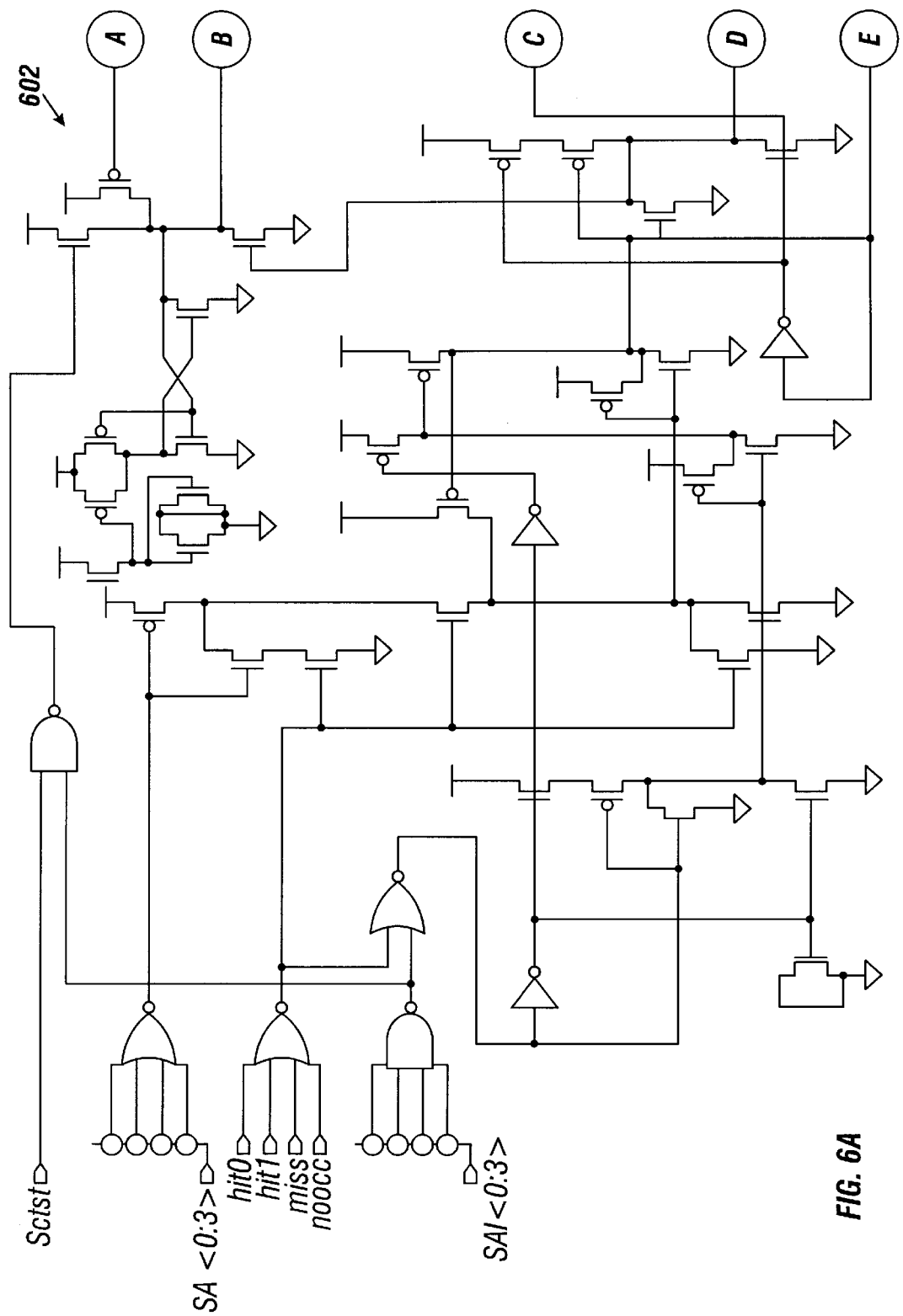
FIG. 6 is a schematic circuit diagram illustrating a handshake circuit in the instruction cache.
Figure 6B:
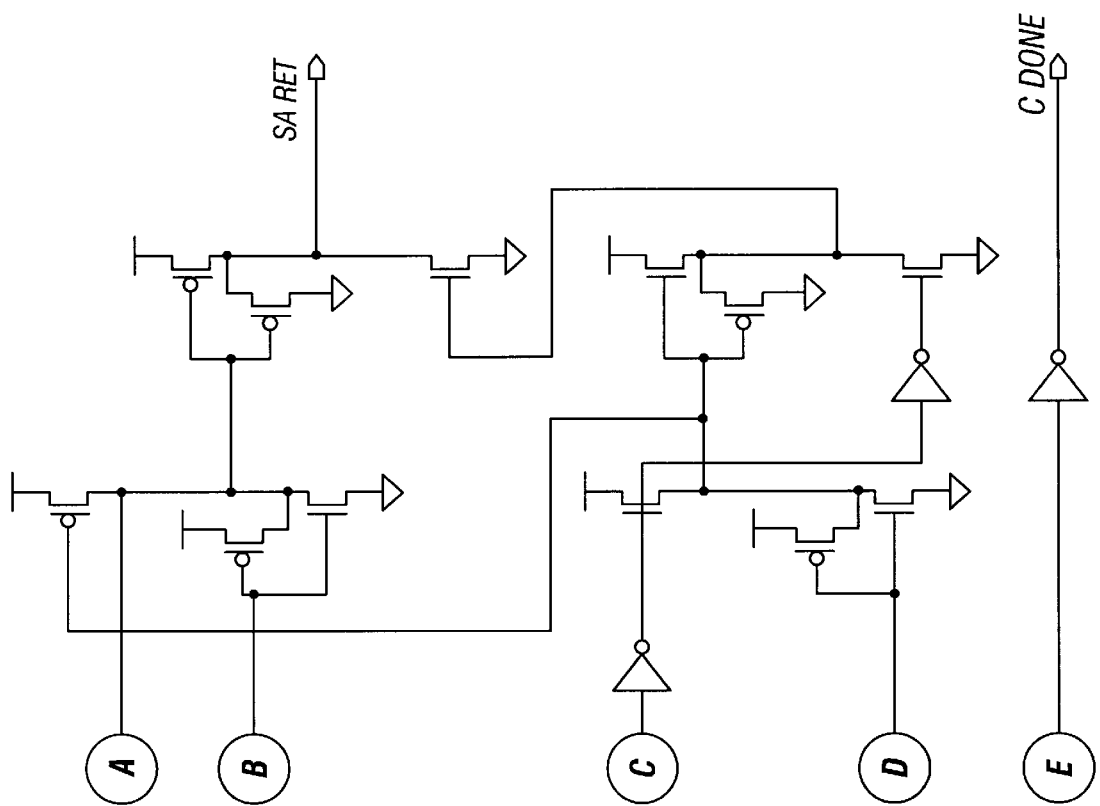

It is certified that error appears in the above-identified patent and that said Letters Patent is hereby corrected as shown below:

Column 3, line 3, delete "FIG. 6 is" and insert --FIGS. 6A and 6B show--.

Column 7, line 1, delete "FIG. 6" and insert -- FIGS. 6A and 6B--.

Signed and Sealed this

Nineteenth Day of December, 2000

Attest:

Q. TODD DICKINSON

*Attesting Officer*     *Commissioner of Patents and Trademarks*